United States Patent
Lander et al.

(10) Patent No.: US 7,189,648 B2
(45) Date of Patent: Mar. 13, 2007

(54) METHOD FOR REDUCING THE CONTACT RESISTANCE OF THE CONNECTION REGIONS OF A SEMICONDUCTOR DEVICE

(75) Inventors: Robert Lander, Leuven (BE); Marcus Johannes Henricus van Dal, Leuven (BE); Jacob Christopher Hooker, Leuven (BE)

(73) Assignees: Interuniversitair Microelektronica Centrum (IMEC), Leuven (BE); Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/966,141

(22) Filed: Oct. 15, 2004

(65) Prior Publication Data

US 2005/0112875 A1 May 26, 2005

(30) Foreign Application Priority Data

Oct. 17, 2003 (BE) .................. 2003/0546

(51) Int. Cl.
*H01L 21/44* (2006.01)
*H01L 21/8238* (2006.01)

(52) U.S. Cl. .................. 438/682; 438/199; 438/685
(58) Field of Classification Search .................. 438/670
See application file for complete search history.

(56) References Cited

U.S. PATENT DOCUMENTS

| 5,851,891 | A | 12/1998 | Dawson et al. |
| 6,177,319 | B1 | 1/2001 | Chen |
| 6,211,000 | B1 | 4/2001 | Spikes et al. |
| 6,281,556 | B1 | 8/2001 | Gerritsen et al. |
| 6,372,566 | B1 * | 4/2002 | Kittl et al. .................. 438/206 |
| 6,440,806 | B1 * | 8/2002 | Xiang .................. 438/290 |
| 6,936,508 | B2 * | 8/2005 | Visokay et al. ............. 438/199 |
| 2002/0011636 | A1 | 1/2002 | Inoue et al. |

FOREIGN PATENT DOCUMENTS

EP 0651076 5/1995
WO WO 03/075330 A1 9/2003

OTHER PUBLICATIONS

Journal of Materials Research, vol. 12, Nos. 1-12 (1997).
Maszara et al., "Transistors with Dual Work Function Metal Gates by Single Full Silicidation (FUSI) of Polysilicon Gates", (2002) IEEE pp. 367-370.

* cited by examiner

*Primary Examiner*—Ha Nguyen
*Assistant Examiner*—Cheung Lee
(74) *Attorney, Agent, or Firm*—Knobbe, Martens, Olson & Bear, LLP (57) ABSTRACT

One embodiment of the invention relates to a method for fabricating a semiconductor device having a semiconductor structure with a silicon region which forms at least one connection region in and/or on a surface of a substrate. The method comprises forming a metal cluster layer from a first, non-siliciding metal, followed by the deposition of a metal layer consisting of a second, siliciding metal. A subsequent heat treatment is responsible for forming a metal silicide from the second metal, the atoms of the first metal being displaced in a direction substantially perpendicular to the surface of the substrate. According to one embodiment of the invention, the atoms of the first metal are displaced by the Kirkendall effect to beneath the metal silicide. If an MOST, for example, is being fabricated, this has advantages both at the location of the source and drain region and at the location of the gate electrode.

18 Claims, 6 Drawing Sheets

METHOD FOR REDUCING THE CONTACT RESISTANCE OF THE CONNECTION REGIONS OF A SEMICONDUCTOR DEVICE

RELATED APPLICATIONS

This application claims the benefit under 35 U.S.C. §119 (a)–(d) of Belgium Application No. 20030546 filed on Oct. 17, 2003.

BACKGROUND OF THE INVENTION

1. Field of the Invention

The present invention relates to a method for fabricating a semiconductor device having a semiconductor element with at least one connection region, in which the contact resistance of the at least one connection region is reduced and in which unfavourable influences of doping elements are avoided.

2. Description of the Related Technology

Due to an increase in integration of devices which comprise, for example, MOSFETs (metal oxide semiconductor field-effect transistors) and are fabricated with the aid of MOS or CMOS processes, the miniaturization of these devices represents an ongoing challenge. Not only do the dimensions and regions of the device need to be reduced in size, but also there continue to be high expectations with regard to quality and yield. The requirements imposed on the junctions in devices of this type are related to a very high activation of the doping, good control of the depth of the junction, etc. At the same time, contacts with a low resistance via silicides are required in order to allow contact via the back surface.

A method for fabricating an IGFET which includes a gate electrode with a low resistance is known from U.S. Pat. No. 5,851,891, which describes the fabrication of an IGFET (insulated gate field-effect transistor) in which the gate electrode of the IGFET is made from silicon and a connection region is formed therein by enabling the silicon to react with a metal applied to it so as to form a metal silicide. Apart from in the vicinity of the dielectric region, the silicon of the gate electrode is doped with doping atoms, such as boron atoms. When the metal silicide is being formed, these doping atoms are forced towards the dielectric region without penetrating through it. On the other hand, the relatively high doping concentration formed in this way in the vicinity of the dielectric region ensures that an undesirable depletion layer effect does not occur in the gate electrode, since such an effect would increase the effective thickness of the dielectric region. The expulsion of doping atoms before the interface of the silicide which is formed is known as the snowplough effect.

One drawback of the method described above is that there is nevertheless still a risk of doping atoms penetrating into or through the dielectric region, which is unfavourable for the electrical properties of the semiconductor element.

SUMMARY OF CERTAIN INVENTIVE ASPECTS OF THE INVENTION

One aspect of the present invention provides a method for fabricating a semiconductor device having at least one connection region in which the contact resistance of the connection region is reduced and unfavourable influences from doping elements are avoided.

Another aspect of the invention provides a method for fabricating a semiconductor device comprising a semiconductor structure having a silicon region forming at least one connection region in and/or on a substrate having a surface. The method comprises forming a metal cluster layer from a first metal over the semiconductor structure or at least over the silicon region thereof. This metal cluster layer is formed in such a manner that in the layer metal clusters alternate with sites where there are no metal clusters. It is preferable that a non-siliciding metal, in other words a metal which is inert with regard to reaction with silicon under the experimental conditions, such as for example W, Mo, Ta, Zr or Nb, is selected for the first metal. Furthermore, one embodiment of the invention comprises the deposition of a metal layer of a second metal on top of the metal cluster layer. The second metal is a siliciding metal and may, for example, be Ti, Co or Ni. Then, the semiconductor device is subjected to at least one heat treatment in which metal silicide is formed through reaction of the second metal with silicon of the silicon region and in which the atoms of the first metal are displaced in a direction substantially perpendicular to the surface of the substrate, and this as a result of the Kirkendall effect.

In one embodiment, the metal atoms selected for the atoms of the first metal are different from the second metal, which forms a metal silicide with silicon. The metal atoms of the first metal are introduced into the vicinity of that region of the regions which form metal silicide whose atoms have the highest diffusion rate during the formation of the metal silicide.

In another embodiment, it is possible to fabricate a semiconductor device having a substrate and a semiconductor body made from silicon. The semiconductor body comprises a semiconductor element having at least two semiconductor regions and having a pn junction formed between two of the semiconductor regions which are of opposite conduction types. The semiconductor body further comprises at least two electrical connection regions, at least one connection region being formed by a metal region being brought into contact with a silicon region of the semiconductor body and these regions being allowed to react with one another to form a metal silicide which forms part of the connection region, atoms of the metal region and of the silicon region reacting with one another. Before the metal silicide is formed, atoms of a material other than silicon or the metal being applied in one of the regions which form metal silicide or between them, in such a manner that these atoms form a region in layer form with interruptions where there are no atoms of the other material, and the atoms of the other material being displaced, during the formation of the metal silicide, in a direction which is perpendicular to the interface between the metal region and the silicon region. The method is characterized in that metal atoms of another metal are selected for the atoms of the other material, and the atoms of the other metal are introduced into or into the vicinity of that region of the regions which form metal silicide whose atoms have the highest diffusion rate during the formation of the metal silicide.

In one embodiment of the invention, the semiconductor structure may comprise a first main electrode and a second main electrode and a control electrode. In one embodiment, the first main electrode and second main electrode can be provided with a connection region. In another embodiment, the control electrode may be provided with a connection region. In a preferred embodiment, both the first and second main electrodes and the control electrode may be provided with a connection region fabricated.

In another embodiment of the invention, the semiconductor structure can be formed as a field-effect transistor having a source region, a drain region and a gate electrode, and the source and drain region and/or gate electrode can be provided with a connection region.

In one embodiment of the invention, the first metal can be selected in such a way that its work function is as close as possible to the value desired for the transistor. By way of example, if an NMOST is being formed, the metal selected has a work function which is as close as possible to the value required for an NMOST, namely approximately 4.2 eV. The same applies to a PMOST, in which case a metal with a work function in the vicinity of approximately 5.2 eV is selected.

In a further embodiment of the invention, a semiconductor device having at least one NMOS transistor and at least one PMOS transistor can be fabricated. In this case, the metal cluster layer of the NMOST may be formed from a metal which is different from the metal cluster layer of the PMOST. In this way, it is then possible to obtain different work functions.

In one embodiment of the invention, the atoms of the first metal can be applied to the silicon region from the vapour phase in the form of clusters of metal atoms. In this way, openings or sites where there are no clusters are incorporated. In another embodiment, the atoms of the first metal layer may, as an alternative, be applied by a uniform layer of the first metal being applied to the silicon region of the substrate, and the uniform layer can then be provided with openings. In yet another embodiment of the invention, the atoms of the first metal can be applied by means of ion implantation.

Still another aspect of the invention provides a semiconductor device having a silicon region and a semiconductor structure with a connection region, the semiconductor device being obtained with the aid of the method.

In one embodiment, the semiconductor structure may comprise a first main electrode, a second main electrode and a control electrode. In yet another embodiment, the semiconductor structure may be a field-effect transistor having a source region, a drain region and a gate electrode.

Other characteristics, properties and advantages of various embodiments of the present invention will become apparent from the following detailed description together with the appended figures which illustrate the basic principles of the invention by way of example.

DESCRIPTION OF CERTAIN INVENTIVE EMBODIMENTS

Various embodiments of the present invention will be described below with reference to a number of figures. However, the invention is not restricted to these embodiments and figures. The figures described are only diagrammatic and are not intended to constitute any form of restriction. The dimensions of some elements are exaggerated and not to scale in the figures in order to illustrate a specific concept.

One embodiment of the present invention can be used to fabricate semiconductor structures having a gate electrode 1 and a source and drain region 2, 3. One embodiment of the invention is based on the insight that on account of the presence of metal atoms in the vicinity of the dielectric region 25 between a substrate 14 and the gate electrode 1, it is possible, to form a metal-containing gate electrode 1. There is then no need or scarcely any need to dope the silicon of the gate electrode 1. Moreover, for example, in the case of a CMOS IC (complementary MOS; contains both n-type and p-type transistors), by applying a different metal in the two types of transistors, it is possible to match the work function thereof to each transistor. The work function of the gate is, according to one embodiment of the invention, controlled by the presence of a metal layer in the border region between the gate electrode 1 and the dielectric region underneath it (see further).

Another embodiment of the invention is based on the insight that metal atoms can be displaced in silicon in a similar way to doping atoms, but by a significantly different mechanism, namely based on the effect named after Kirkendall. The Kirkendall effect is based on the displacement of foreign atoms in a reaction matrix as a result of them being swept through vacancies which, in a matrix of this type, are subject to a displacement in the opposite direction to the direction of the fastest-diffusing component of the reaction matrix. The snowplough effect, on the other hand, is based on a differing solubility of doping atoms in silicon and in metal silicide. Since the solubility in the metal silicide is much lower than in silicon, the doping atoms are precipitated out of the metal silicide and then pass into the remaining silicon which has not yet reacted. In one embodiment, this effect originates from a physical process other than the Kirkendall effect. It is caused by the repulsion of the doping atoms by the growing metal component consequent on a too low solubility. The doping atoms are thereby, in case of the snowplough effect, shoved in front of the moving surface of the metal component.

Figure 1:
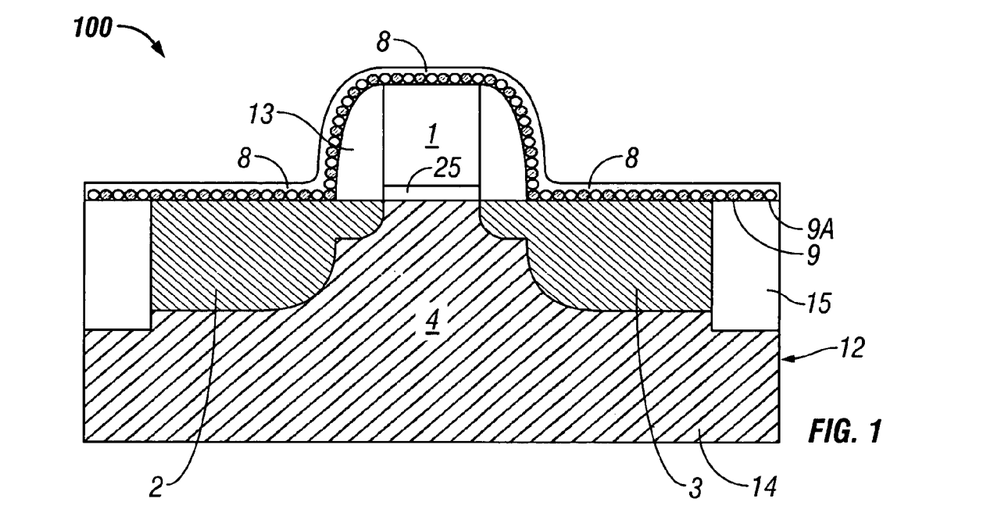
FIGS. 1–3 illustrate a cross section through a semiconductor device in successive stages of the fabrication in accordance with a first embodiment of the invention.
Figure 2:
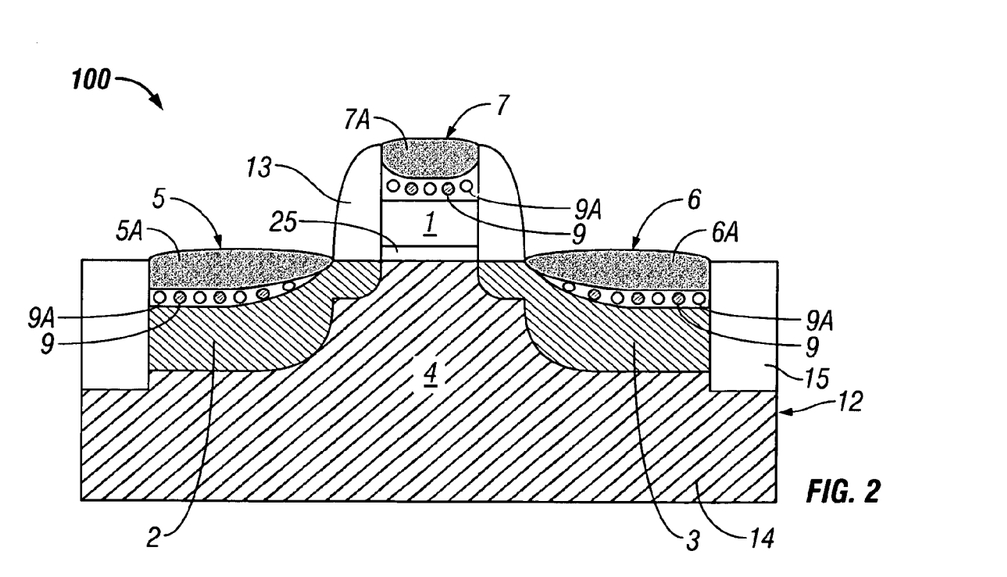
Figure 3:
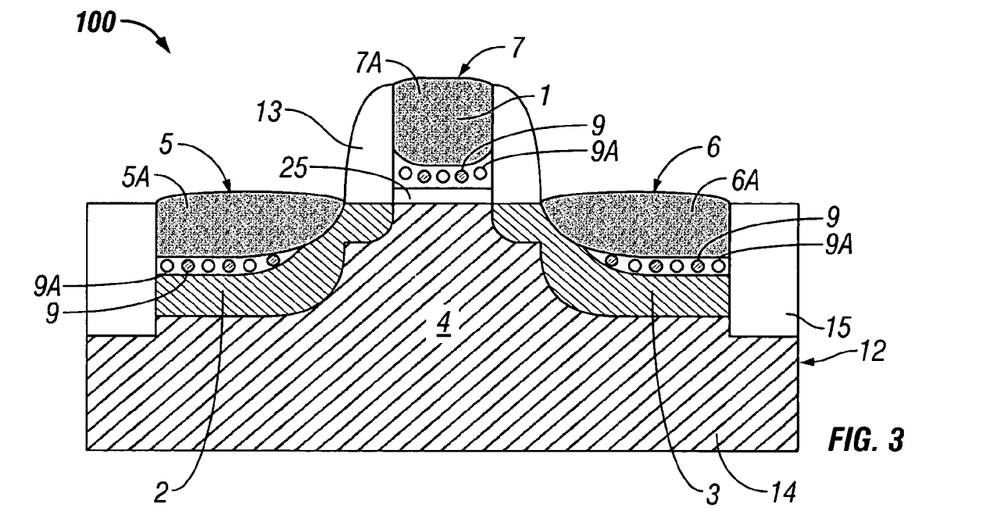

FIGS. 1–3 illustrate a cross section through a semiconductor device 100 in successive stages of the fabrication in accordance with a first embodiment of the invention. Only the most relevant stages are shown in the drawing. The starting point for the formation of the device 100 is a semiconductor body 12 (FIG. 1), which in this embodiment of the invention may, for example, be formed from silicon and has a substrate 14, which in this embodiment may likewise be formed from silicon and in which a MOSFET is formed, having a source region 2, a channel region 4 of opposite conduction type to the source region 2, and a drain region 3 of the same conduction type as the source region 2. Above the channel region 4 a dielectric region 25 is formed, for example, from silicon dioxide, and above this there is a gate electrode 1, which in the present embodiment may contain polycrystalline silicon.

At the edges of the semiconductor body 12, the device 100 comprises insulation regions 15, for example, what are known as trench or LOCOS (locally oxidized silicon) isolations which may, for example, be formed from silicon dioxide. On both sides of the gate electrode 1 there are what are known as spacers 13, which may likewise be formed from silicon dioxide. Up to this stage, the device 100 is fabricated in a customary way with the aid of generally known techniques, such as LOCOS oxidation, implantation, diffusion, CVD, (plasma) etching and photolithography.

Then, the surface of the semiconductor body 12 is covered, for example, with the aid of chemical vapour deposition (CVD), with a layer of metal clusters 9 formed from a first metal, which may, for example, be tungsten. The use of chemical vapour deposition means that between the clusters of metal cluster layer 9 there are openings 9A where there is no tungsten, or more generally no first metal. These interruptions in the cluster layer 9 consisting of the first metal may alternatively, in another embodiment, be formed by applying the atoms of the metal cluster layer 9 as a uniform layer of the first metal and then forming openings in this uniform layer. These openings may be formed, for example, with the aid of photolithography and etching. In yet another alternative, small particles of an inert material can be applied to the surface of the semiconductor body 12, after which the atoms of the first metal can then be applied over this surface in the form of a layer. The layer of the first metal can then be provided with the desired openings with the aid of a lift-off technique in which the particles of the inert material are removed selectively.

The thickness of the clusters in the metal cluster layer 9 may, for example, be about 1 to 2 nm, and the dimensions of the openings 9A in this cluster layer 9 may, for example, be from about 1 to about 5 nm. The metal cluster layer 9 is preferably formed from a metal which is inert with respect to silicon under the conditions in which the metal silicide is formed in a subsequent step. In one embodiment, these metals also have a suitable work function for an N- or P-MOST, depending on which transistor is desired for a specific application. In addition to tungsten, other examples of suitable metals may include molybdenum, tantalum, zirconium and niobium.

Then, for example, with the aid of vapour deposition, a metal region 8, which is formed from a second metal, is applied over the metal cluster layer 9. This metal region 8 may, for example, contain titanium and generally be a metal which can form a silicide, for example, in this exemplary embodiment titanium disilicide, by reaction with silicon. In one embodiment, the metal region 8 formed from the second metal is thicker than the metal cluster layer 9 formed from the first metal and may be between about 5 and about 30 nm, for example, about 15 nm, thick.

Then, for example, by means of a heat treatment carried out on the semiconductor body 12, silicides of the second metal, in this exemplary embodiment titanium disilicides 5A, 6A, 7A are formed at the location of the source region 2, the drain region 3 and the gate electrode 1 as a result of the second metal, in this embodiment titanium, of metal region 8 reacting with silicon of the source and drain regions 2, 3 and of the gate electrode 1. This can take place, for example, at a temperature of between about 500 and about 600° C., for example, at about 550° C. (cf. FIG. 2). In this way, connection regions 5, 6, 7 of source region 2, drain region 3 and gate electrode 1, respectively, are formed. As a result of the Kirkendall effect, the clusters of metal cluster layer 9, which do not participate in the silicide-forming reaction, are displaced in the gate electrode 1 towards the dielectric region 25. Thus, the implanted atoms are pushed in the direction of the border region as a consequence of the Kirkendall effect. If, for example, titanium disilicide is being formed, silicon is the fastest-moving component. This means that foreign atoms which are then present, for example, in the silicon move, or more accurately are displaced, in a direction away from the titanium. In one embodiment of the invention, therefore, the atoms of the first metal are displaced in the direction of the dielectric region 25. One important condition for the Kirkendall effect is that the foreign atoms, i.e., the atoms of the first metal, be present in a region in layer form which is provided with interruptions. On account of the same effect, the clusters of the metal cluster layer 9 at the location of the source region 2 and the drain region 3 for the metal silicide 5A, 6A formed there are expelled into the source region 2 and the drain region 3. Those parts of the metal region 8 which are located above the insulation regions 15 and on the spacers 13 can then be removed with the aid of, for example, a wet-etching method.

During a subsequent heat treatment, typically in the range from about 600 to about 850° C., the silicide-forming reaction can then be continued, with the silicon being completely consumed at the location of the gate electrode 1 (FIG. 3). At the location of the gate electrode 1, the metal cluster layer 9 then forms a part of the gate electrode 1 which is located in the vicinity of or against the dielectric region 25 and beneath the metal silicide 7A and in this embodiment has a work function of about 4.6 eV, which is suitable for an NMOST and is close to the value of about 4.3 eV desired for this transistor. There is then, at the location of the source region 2 and the drain region 3, a thin metal cluster layer 9 between the silicon-containing part of the source region 2 and the drain region 3, on one hand, and the metal silicide formed on these regions 2, 3, in this embodiment titanium disilicides 5A, 6A, on the other hand. The result is a reduced contact resistance for the source region 2 and the drain region 3.

Finally, fabrication of the transistor is completed in the customary way as is known to a person skilled in the art, i.e., one or more dielectric layers are applied and provided with contact openings, after which a conductor layer, for example, of aluminium, is applied and patterned so as to form connection conductors for the source and drain regions 2, 3 and the gate electrode 1. These steps are not shown in the figures, once again for the sake of simplicity. Individual devices 100 are then obtained by means of a separation technique, for example, sawing.

In the above-mentioned exemplary embodiment, both the gate electrode 1 and the source and drain regions 2, 3 are provided with a metal cluster layer 9. In one embodiment, the source and drain regions 2, 3, independently of the gate electrode 1, may be provided with a metal cluster layer 9 between the silicon-containing part, on one hand, and the metal silicide 5A, 6A, on the other hand. In this way, as has already been discussed above, the contact resistance of the connection for the source and drain regions 2, 3 is reduced. Independent application is possible, for example, if the gate electrode 1 of the transistor has already been provided with a metal in some other way and is not formed as a silicon region and is also not provided with a connection region containing metal silicide.

In one embodiment, the latter application can advantageously be used not only for the fabrication of field-effect transistors but also for bipolar transistors in which, for example, the base region and the emitter region are provided with a connection region containing a metal silicide. Even devices which comprise no more than a single semiconductor diode, for example, a Schottky diode or a pn diode, may advantageously be fabricated with the aid of a method according to one embodiment of the invention, in particular if one of the regions forming the diode junction is particularly thin and is provided with a connection region containing a metal silicide.

FIGS. 4–7 illustrate a cross section through a semiconductor device in successive stages of the fabrication in accordance with a second embodiment of the invention. In discussing these figures, in particular the differences compared to the method described above will be explained.

Corresponding or identical process steps can be carried out as discussed above in connection with the first exemplary embodiment.

Figure 4:
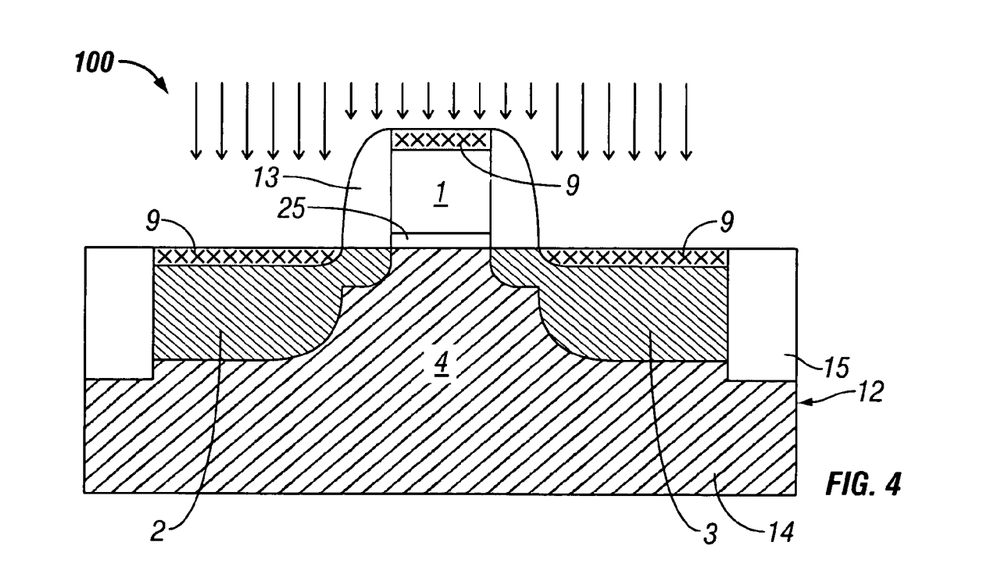
FIGS. 4–7 illustrate a cross section through a semiconductor device in successive stages of the fabrication in accordance with a second embodiment of the invention.
Figure 5:
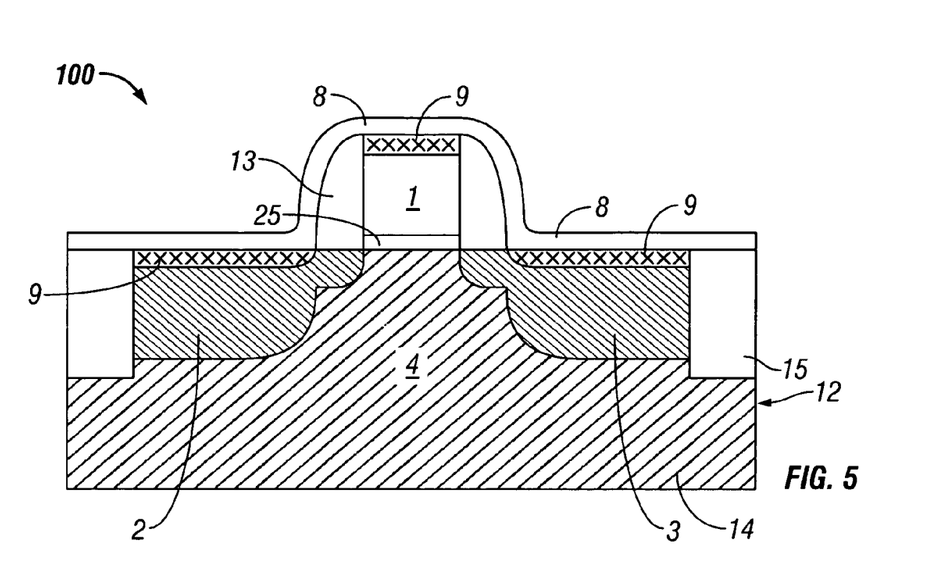
Figure 6:
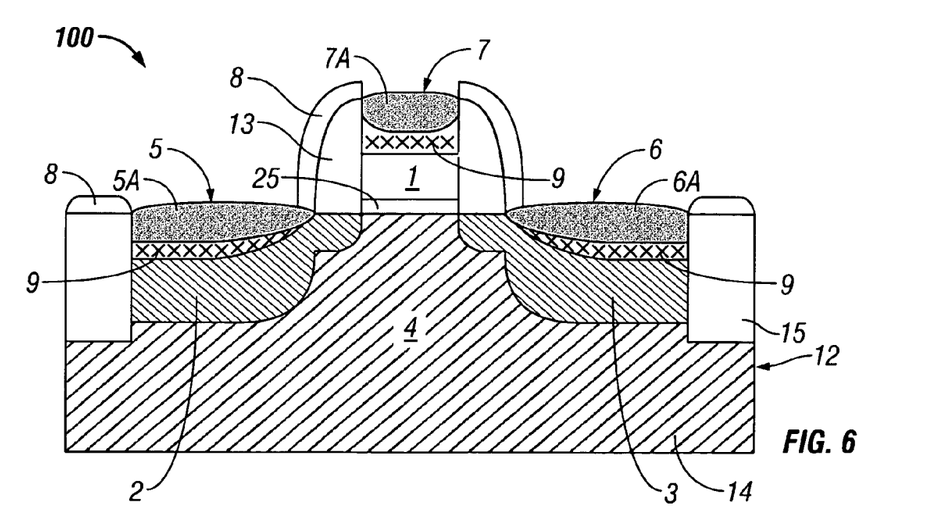
Figure 7:
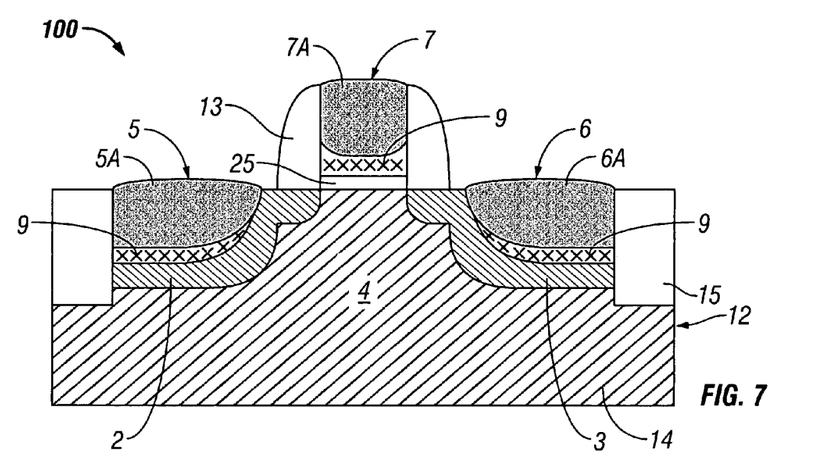

The most significant difference from the first exemplary embodiment is that in this case the atoms of the first metal which form metal cluster layer 9 are introduced into the surface of the semiconductor body 12 or of the semiconductor structure applied to it by means of an ion implantation step I (FIG. 4). In this second embodiment, the first metal, just as in the first exemplary embodiment, may be a metal which is inert with respect to silicon, for example, tungsten, tantalum, niobium or zirconium. This ion implantation step automatically provides the desired openings between the atoms of the first metal in the metal cluster layer 9. Moreover, this method is accurate, reproducible and easy to carry out locally. The implantation energy may, for example, be 40 keV, and the implantation dose may, for example, be 1 to $5 \times 10^{15}$ at/cm². This forms a metal cluster layer 9 at the location of the source region 2, the drain region 3 and the gate electrode 1.

The fabrication of the device 100 is then continued as has already been discussed in the first exemplary embodiment. First of all, a metal region 8, formed from a second metal, is provided (cf. FIG. 5). Then, in a first heating step, for example, at a temperature of between about 500° C. and about 600° C., metal suicides 5A, 6A, 7A can be formed at the location of the source and drain regions 2, 3 and at the location of the gate electrode 1, with the clusters being displaced downwards from metal cluster layer 9 by the Kirkendall effect (cf. FIG. 6). In a second heat treatment, which can be carried out at a temperature of between about 600° C. and about 850° C., these processes are continued until, for example, the silicon has been completely consumed at the location of the gate electrode 1 (cf. FIG. 7).

The further processing of the semiconductor device can then be carried out in the customary way which is known to a person skilled in the art.

FIGS. 8–13 illustrate a cross section through a semiconductor device in successive stages of the fabrication in accordance with a third embodiment of the invention. The most significant difference between this exemplary embodiment and the first exemplary embodiment resides in the fact that in the present exemplary embodiment a CMOS IC is fabricated, in which, therefore, both NMOS and PMOS transistors are formed. In view of this, in the present embodiment the semiconductor body 1 comprises two channel regions 4, 40 of opposite conduction types, it being possible for the channel region 4 to be formed by, for example, a suitable ion implantation into the substrate 14.

Figure 8:
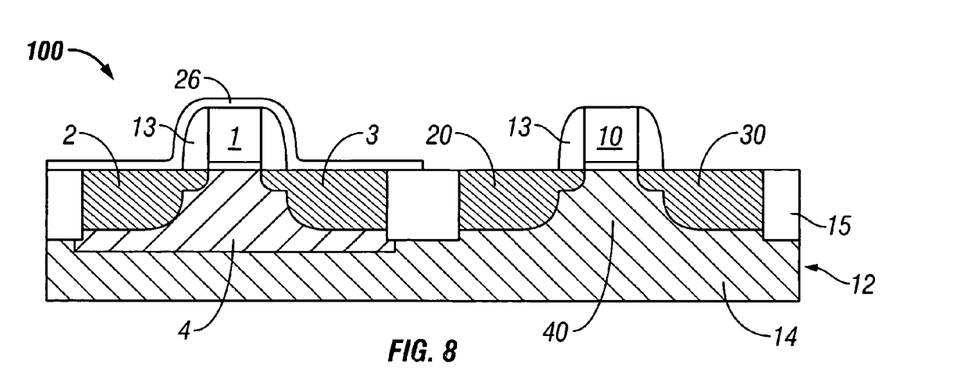
FIGS. 8–13 illustrate a cross section through a semiconductor device in successive stages of the fabrication in accordance with a third embodiment of the invention.
Figure 9:
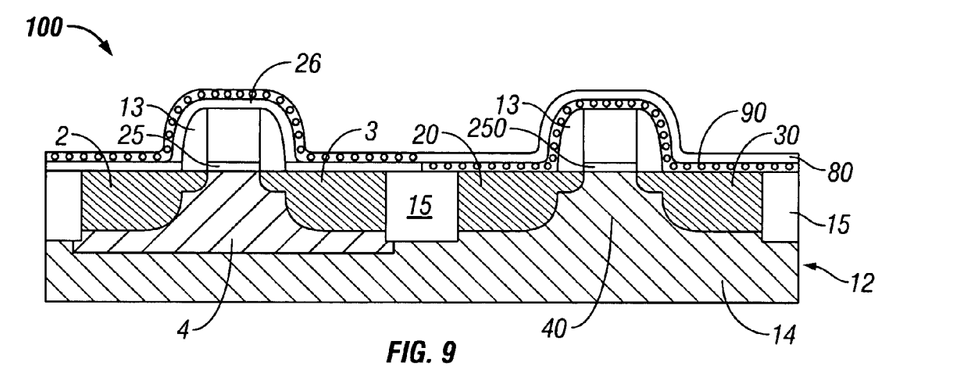

First of all, in the relevant stage, one of the transistors, in the present exemplary embodiment the first transistor, is covered with a mask 26, which may be formed, for example, from silicon dioxide (FIG. 8). Then, a metal cluster layer 90, in this exemplary embodiment formed from metal clusters of a first metal which is inert with respect to silicon, for example, tungsten, tantalum, zirconium or niobium, is formed on the surface of the semiconductor body 12 (cf. FIG. 9). Then, a second metal layer 80 is applied, formed from a second metal which has siliciding properties. Then, the applied layers 80, 90 are removed again at the location of the first transistor with the aid of, for example, a lift-off process which also removes the mask 26.

Figure 10:
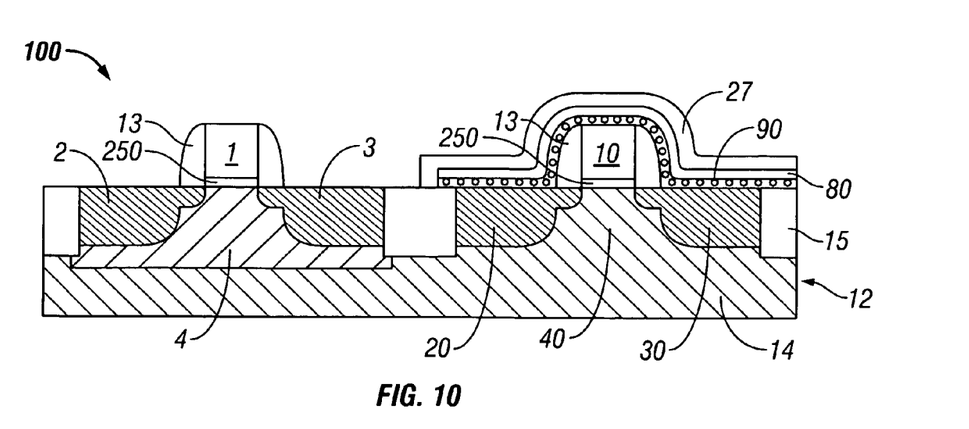
Figure 11:
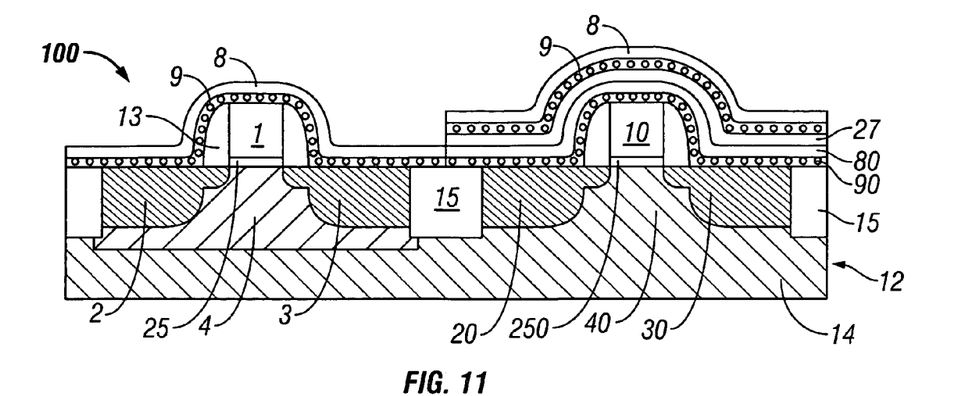
Figure 12:
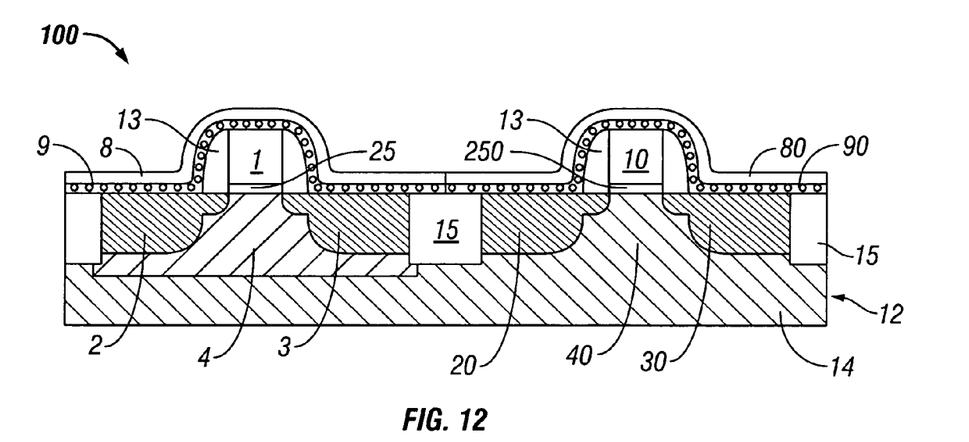

Then, the second transistor, along with the metal cluster layer 90 and metal layer 80, is covered with a mask 27 (FIG. 10). Then, once again, the metal cluster layer 9, formed from a third metal which is inert for reaction with silicon and is preferably a different metal from the first metal which was selected for the metal cluster layer 90 of the second transistor, and a metal layer 8, formed from a fourth metal having siliciding properties, are applied (FIG. 11). Then, these layers 8, 9 (cf. FIG. 12) are removed at the location of the second transistor, for example by a lift-off process, with mask 27 also being removed.

Figure 13:
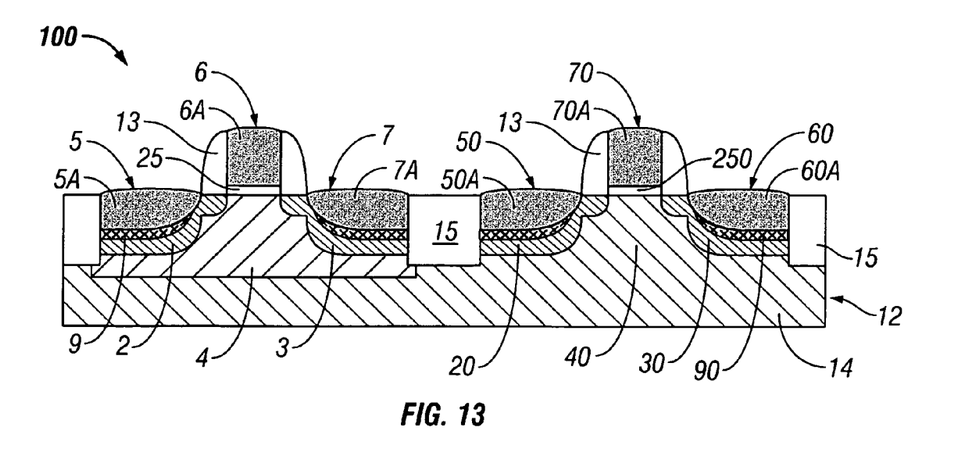

In a subsequent step, metal silicides 5A, 6A, 7A, and in this case also metal silicides 50A, 60A and 70A, which preferably contain a different metal from metal silicides 5A, 6A, 7A, are formed at the location of the first transistor and the second transistor, respectively, once again in one or more heat treatments. Once again, as a result of the Kirkendall effect, metal cluster layers 9, 90 are formed beneath the metal silicides 5A, 6A, 7A and 50A, 60A, 70A which have been formed and in the vicinity of the dielectric region 25 and 250. If, by way of example, the first transistor is an NMOST, the metal cluster layer 9 for this transistor is selected to be a metal whose work function is closest to the value of approximately 4.2 eV desired for such a transistor. If the second transistor is then a PMOST, the metal cluster layer 90 for this transistor is selected to be a different metal, the work function of which is closer to the value of approximately 5.2 eV which is desired for such a transistor.

In one embodiment, in this variant, as described in this third exemplary embodiment, there is the largest possible degree of freedom in terms of the choice of the fourth metal 8 and the third metal 9 and also with regard to the thickness of the layers formed therefrom. Obviously, this variant can easily be modified, for example, to give a variant in which the metal 8 at the two transistors is the same and has the same thickness. In that case, the lift-off of the masks 26 and 27 is carried out, for example, before the metal region 8 is formed. It is also possible, by means of a simple variant, if desired for the source and drain regions 2, 3 and 20, 30 of both the NMOST and the PMOST to be provided with a metal cluster layer 9, 90 made from the same metal.

According to embodiments of the present invention, there are three important materials, i.e., the material of which the control electrode 1 is made, the material of the metal layer 8 and the material of the metal cluster layer 9. In one embodiment, the material of the control electrode 1 and the material of the metal layer 8 form a junction in which only one diffusing material is present. In this embodiment, the material of which the control electrode 1 is formed is thereby chosen such that it comprises the diffusing element, because then, according to one embodiment of the invention, the atoms of the cluster layer 9 are pushed in the direction of the dielectric region 25. The material of which the control electrode 1 is formed cannot have a negative influence on the dielectric region 25. In one embodiment, the material from which the metalciusterlayer 9 is made behaves as a so-called "Kirkendall marker". This means that the material is inert and substantially immovable during the formation of the silicide compound. With substantially immovable is meant that the material may not diffuse at relevant temperatures at which the silicide compound is formed.

The invention is not restricted to the exemplary embodiments described, since numerous variations and modifications are possible for a person skilled in the art within the scope of the invention. For example, it is possible to fabricate devices having a different geometry and/or different dimensions. As an alternative to a substrate 14 made from Si, it is also possible to use a substrate 14 made from glass, ceramic or a plastic. The semiconductor body 12 can then be formed by the so-called SOI (silicon on insulator). In this context, it is optionally possible to use a so-called substrate transfer technique.

It should also be noted that materials other than those mentioned in the examples can be used within the scope of the invention. For example, as an alternative to titanium it is also possible to use other metals, such as nickel and cobalt. With a view to determining the order in which a layer of one of these metals and a layer of silicon are applied, it should obviously be established which component of the silicide which is to be formed, i.e., nickel or cobalt, on one hand, and silicon, on the other hand, diffuses most quickly during the formation of the silicide. It is conceivable that this will be different for two different silicides of the same metal, such as cobalt monosilicide and cobalt disilicide. It is also possible to use other deposition techniques for the above-mentioned or other materials, such as epitaxy, CVD (chemical vapour deposition), sputtering and vapour deposition. As an alternative to wet-chemical etching methods, it is also possible to use "dry" techniques, for example, plasma etching.

It should also be noted that it is not necessary for the dielectric layer 25 to be of the same material or the same thickness for all the transistors.

Furthermore, it should be noted that the device 100 may further comprise active and passive semiconductor elements or electronic components, such as a greater number of diodes and/or transistors and resistors and/or capacitors, optionally in the form of an integrated circuit. The fabrication is obviously adapted appropriately. However, as has already been noted above, the method can advantageously also be used for the fabrication of individual (semi-)discrete devices which comprise one, optionally bipolar, transistor or even one diode.

Although the invention has been described with reference to specific preferred embodiments, it will be clear to a person skilled in the art that numerous alterations and modifications in form and detail are possible without departing from the scope of protection of the present invention.

The invention claimed is:

1. A method of fabricating a semiconductor device comprising a semiconductor structure having a silicon region forming at least one connection region in and/or on a surface of a substrate, the method comprising:
   forming, at least at the silicon region, a metal cluster layer from a first metal, such that, in the metal cluster layer, metal clusters alternate with sites where there are no metal clusters, the first metal being a non-siliciding metal at predetermined conditions;
   depositing a metal layer of a second metal on top of the metal cluster layer, the second metal being a siliciding metal; and
   carrying out at least one heat treatment at the predetermined conditions on the second metal layer so as to form metal silicides through reaction of the second metal with the silicon region, wherein atoms of the first metal are displaced in a direction substantially perpendicular to the surface of the substrate.

2. The method according to claim 1, wherein the first metal is selected from the group consisting of W, Mo, Ta, Zr and Nb.

3. The method according to claim 1, wherein the semiconductor structure includes a first main electrode, a second main electrode and a control electrode.

4. The method according to claim 3, wherein at least one of the first main electrode and the second main electrode includes a connection region.

5. The method according to claim 3, wherein the control electrode includes a connection region.

6. The method according to claim 1, wherein the semiconductor structure is formed as a field-effect transistor having a source region, a drain region and a gate electrode.

7. The method according to claim 6, wherein the first metal includes a metal whose work function is as close as possible to the value desired for the transistor.

8. The method according to claim 6, wherein at least one NMOS field-effect transistor and at least one PMOS field-effect transistor are formed, the metal cluster layer of the NMOS transistor being formed from a metal different from the metal cluster layer of the PMOS transistor.

9. The method according to claim 1, wherein the atoms of the first metal are applied to the silicon region from a vapor phase in the form of clusters of metal atoms.

10. The method according to claim 1, wherein the atoms of the first metal are applied by a uniform layer of the first metal being applied to the silicon region, the uniform layer being provided with openings.

11. The method according to claim 1, wherein the atoms of the first metal are applied by ion implantation.

12. The method according to claim 1, wherein the thickness of the clusters in the metal cluster layer is from about 1 nm to about 2 nm, and the length of each of the sites where there are no metal clusters is from about mm to about 5 nm.

13. The method according to claim 1, wherein the second metal layer is thicker than the first metal layer.

14. The method according to claim 1, wherein the thickness of the second metal layer is between about 5 nm and 30 nm.

15. The method according to claim 1, the heat treatment is performed at a temperature of between about 500 and 600° C.

16. The method according to claim 1, wherein atoms of the first metal form a metal cluster layer at the interface between the metal silicide and the silicon region.

17. A method of fabricating a semiconductor device comprising a semiconductor structure having a silicon region forming at least one connection region in and/or on a surface substrate, the method comprising:
   applying a layer of a first metal at least at the silicon region, wherein the first metal is a non-siliciding metal at predetermined conditions;
   providing openings in the first metal layer at least at the silicon region;
   depositing a metal layer of a second metal on the first metal layer, wherein the second metal is a siliciding metal; and
   performing heat treatment at the predetermined conditions on the second metal layer so as to form metal silicides through reaction of the second metal with the silicon region, wherein atoms of the first metal are displaced in a direction substantially perpendicular to the surface of the substrate.

18. The method according to claim 17, wherein the openings are defined by the use of a lift-off technique.

* * * * *

UNITED STATES PATENT AND TRADEMARK OFFICE
CERTIFICATE OF CORRECTION

PATENT NO. : 7,189,648 B2
APPLICATION NO. : 10/966141
DATED : March 13, 2007
INVENTOR(S) : Robert Lander et al.

It is certified that error appears in the above-identified patent and that said Letters Patent is hereby corrected as shown below:

Column 5, Line 58 - Delete "being." and insert -- being --, therefor.

Column 7, Line 26 - Delete "suicides" and insert -- silicides --, therefor.

Column 8, Line 51 – Delete "metalciusterlayer" and insert -- metalclusterlayer --, therefor.

Column 10, Line 29 – In Claim 12, after "about" delete "mm" and insert -- 1 nm --, therefor.

Signed and Sealed this

Seventh Day of August, 2007

JON W. DUDAS
*Director of the United States Patent and Trademark Office*